(12) United States Patent
Palumbo et al.

(10) Patent No.: US 7,663,927 B2
(45) Date of Patent: Feb. 16, 2010

(54) READING VOLTAGE GENERATOR FOR A NON-VOLATILE EEPROM MEMORY CELL MATRIX OF A SEMICONDUCTOR DEVICE AND CORRESPONDING MANUFACTURING PROCESS

(75) Inventors: Elisabetta Palumbo, Bernareggio (IT); Paola Zuliani, Milan (IT); Roberto Annunziata, Monza (IT); Daniele Zompi, Misterbianco (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 20 days.

(21) Appl. No.: 11/941,650

(22) Filed: Nov. 16, 2007

(65) Prior Publication Data
US 2008/0123404 A1    May 29, 2008

(30) Foreign Application Priority Data
Nov. 17, 2006    (IT)    .......................... MI2006A2210

(51) Int. Cl.
G11C 16/06    (2006.01)
(52) U.S. Cl. .............................. 365/185.2; 365/185.05; 365/185.25; 365/185.21; 365/185.1
(58) Field of Classification Search .............. 365/185.2, 365/185.05, 185.25, 185.21, 185.1
See application file for complete search history.

(56) References Cited

U.S. PATENT DOCUMENTS

| | | | | |
|---|---|---|---|---|
| 4,377,857 | A * | 3/1983 | Tickle | 365/185.33 |
| 4,612,629 | A * | 9/1986 | Harari | 365/185.08 |
| 5,798,967 | A * | 8/1998 | Sarin et al. | 365/185.21 |
| 5,912,840 | A * | 6/1999 | Gonzalez et al. | 365/185.05 |
| 6,452,152 | B1 * | 9/2002 | Yang | 250/208.1 |
| 6,650,583 | B2 * | 11/2003 | Haraguchi et al. | 365/201 |
| 6,909,639 | B2 * | 6/2005 | Park et al. | 365/185.25 |
| 7,142,457 | B2 * | 11/2006 | Lee et al. | 365/185.21 |
| 7,423,898 | B2 * | 9/2008 | Tanizaki et al. | 365/148 |

* cited by examiner

*Primary Examiner*—Viet Q Nguyen
(74) *Attorney, Agent, or Firm*—Lisa K. Jorgenson; E. Russell Tarleton; Seed IP Law Group PLLC

(57) ABSTRACT

A reference voltage generator for a matrix of non-volatile memory cells of the EEPROM type, comprises at least one array enabled by an access transistor. The array comprises at least one reference cell associated with a relative select transistor, the transistors and the cell being realized on a semiconductor substrate and having active regions delimited by suitable field oxide regions and covered by a tunnel oxide layer and comprising at least one floating gate realized by a first polysilicon layer and covered by a dielectric layer and by a second polysilicon layer. Advantageously, the floating gate of the reference cells is contacted by a first contact terminal connected to a discharge transistor for the periodical discharge of possibly present charges. A process manufactures such a voltage generator.

22 Claims, 10 Drawing Sheets

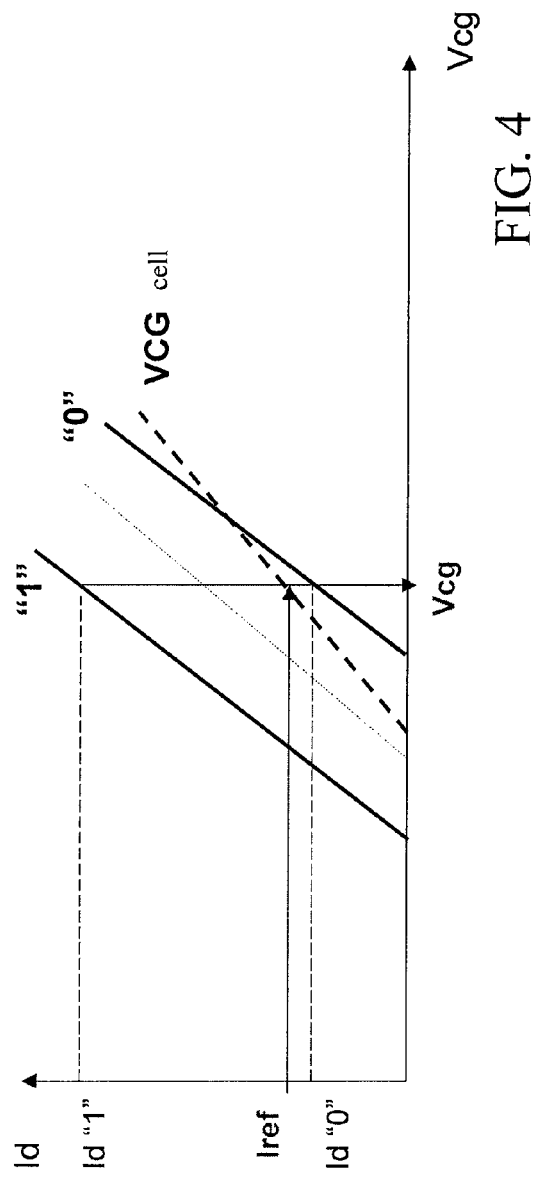
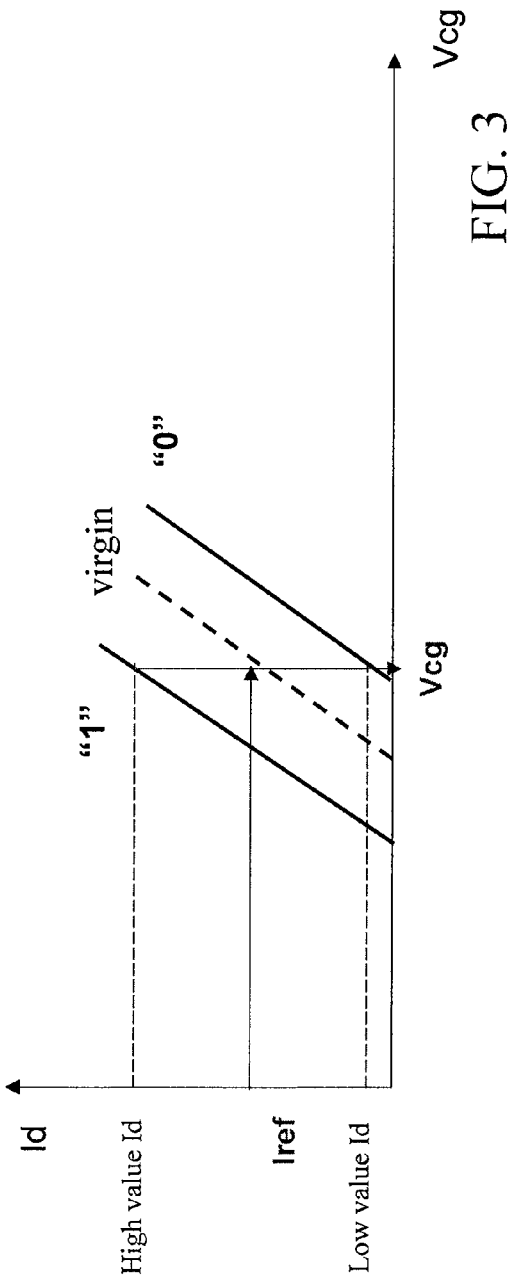
FIG. 3
FIG. 4

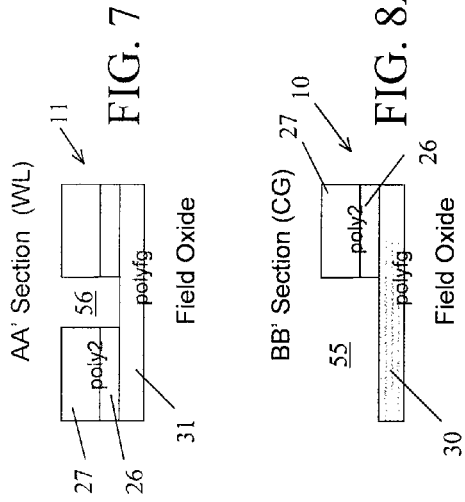
FIG. 6
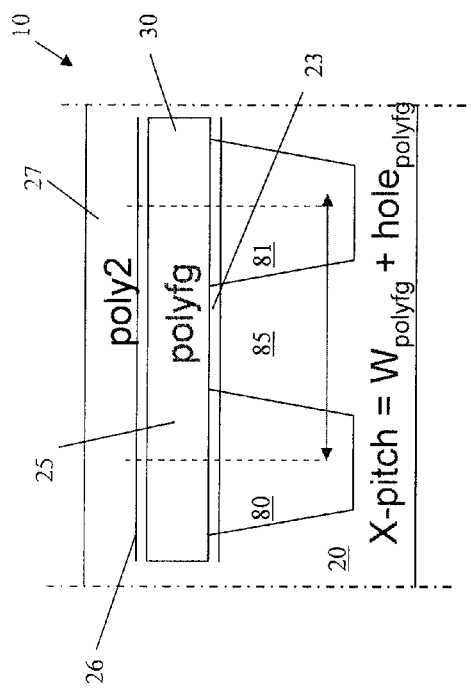
FIG. 7
FIG. 8A
FIG. 8B
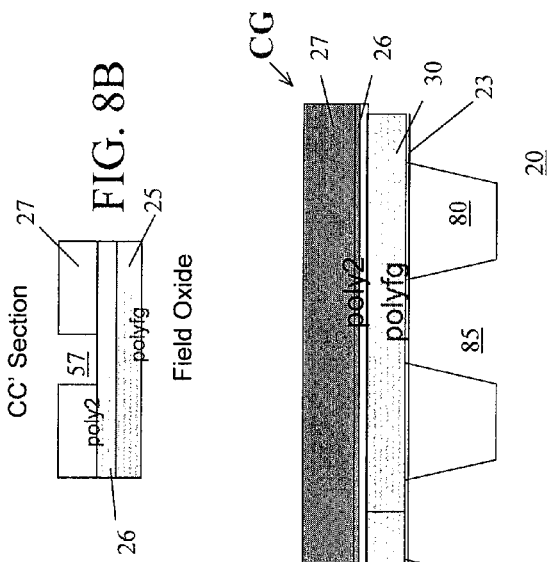
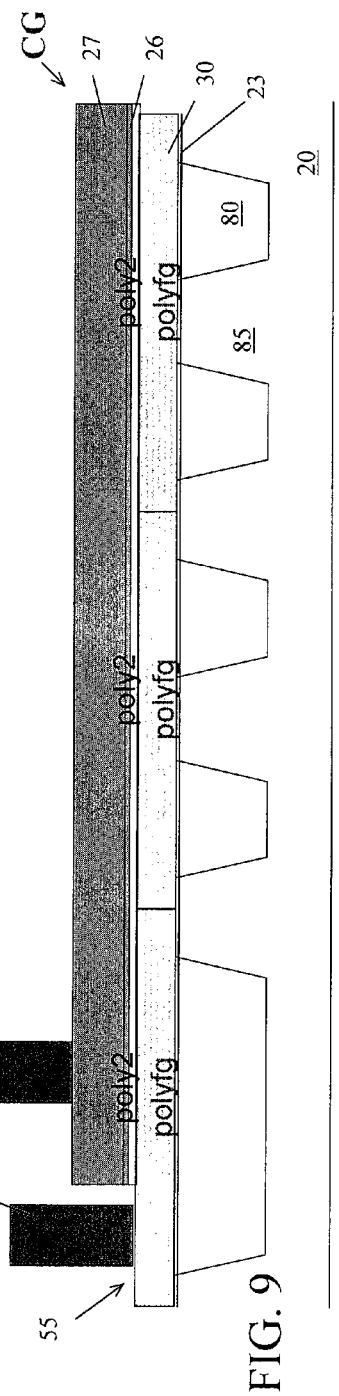
FIG. 9

READING VOLTAGE GENERATOR FOR A NON-VOLATILE EEPROM MEMORY CELL MATRIX OF A SEMICONDUCTOR DEVICE AND CORRESPONDING MANUFACTURING PROCESS

BACKGROUND

1. Technical Field

The present invention relates to an architecture of a reading voltage generator for a matrix of EEPROM non-volatile memory cells of a semiconductor device.

More in particular, the invention relates to an architecture of a reading voltage generator which comprises at least one array enabled by an access transistor, the array comprising in turn at least one reference cell associated with a relevant select transistor, these select and access transistors and this reference cell being realized on a semiconductor substrate with active areas covered by a gate oxide layer and comprising a floating gate realized by a first polysilicon layer, covered by a dielectric layer and by a second polysilicon layer.

The present invention also relates to a process for manufacturing a voltage generator for a matrix of non-volatile memory cells of a semiconductor device.

2. Description of the Related Art

As it is well known, nowadays applications requiring the use of data storage device are more and more widespread such as for example semiconductor devices with EEPROM non-volatile memory cells.

These devices, in fact, show the characteristic of having an extremely reduced current consume both during a modify operation, such as programming or erasing of the content of the memory cells, and during a reading operation.

Moreover, with these devices it is possible to simultaneously erase more cells in parallel, single word by single word, and to program single bit by single bit, i.e., single cell by single cell.

EEPROM memory devices are widely used for example in the realization of Smart Cards.

The continuous request for miniaturization of Smart Cards and thus of the memory devices therein contained has pushed the research towards greater and greater integration scales, with a reduction of the sizes of the components. On the other hand, this makes it more critical the control of the characteristics of these components, in particular of memory cells, with more and more serious difficulties in ensuring acceptable reliability performances for reduced size cells.

It is also known that non-volatile memory cells are usually integrated on a substrate of semiconductor material and ordered in rows and columns for the formation of a matrix of cells, where the element for the information storage, i.e., the single cell, is a MOS transistor of the floating gate type. The amount of charge contained in the floating gate defines the logic state or level of the single cell.

In EEPROM memories, this amount of charge is altered by exploiting a passage of charges thanks to the tunnel effect through a thin silicon oxide layer, so called tunnel oxide, which is interposed between the substrate of semiconductor material and the floating gate of the cell transistor.

Express reference will be now made to EEPROM memory cells which provide two self-aligned polysilicon levels. A memory cell of this type is for example schematically shown in FIGS. 1A and 1B, globally indicated with 1, respectively shown along two perpendicular directions indicated with X and Y. The memory cell 1 is formed above a silicon substrate 2 with an overlapped gate oxide layer 3 and comprises a floating gate 5 realized by a first polysilicon layer polyfg and having size equal to $L_{polyfg}$ along the direction Y, as well as a control gate 7, realized by a second polysilicon layer poly2, overlapped onto the floating gate 5 and insulated from this latter by means of a dielectric layer 6 so called interpoly having thickness equal to $thck_{polyfg}$. Below this polysilicon floating gate 5 a channel region is defined having size equal to $W_{polyfg}$ along the direction X.

The memory cell 1 also comprises at least one active area 8 separated by field oxide portions 9A, 9B.

As shown in particular in FIG. 1B, the floating gate 5 of each memory cell 1 is electrically insulated from the floating gate 5 of each adjacent cell by means of suitable openings 4 having width equal to $hole_{polyfg}$ along the direction X, these openings being realized in the first polysilicon layer polyfg with a mask. In this way the electric discontinuity between the floating gates 5 of these cells is ensured.

During the realization of the memory cells 1 the mask allows the removal of the first polysilicon layer polyfg and the definition of the openings 4 between the memory cells 1 with successive filling of these openings 4 by the second polysilicon layer poly2 which is deposited above the dielectric layer interpoly 6.

An architecture of a memory device of the EEPROM type comprises, associated with each memory cell 1, a relative select transistor realized in a similar way to the memory cell 1 itself.

Generally, such an architecture also provides an associated circuitry comprising transistors which, according to the different embodiments, can comprise a single or a double polysilicon layer with or without the interpoly dielectric layer.

In any way, this circuitry comprises a reading voltage generator of the memory cells, schematically shown in FIG. 2, which can comprise an array of reference cells, realized as the memory cells and suitable for generating a reading reference voltage Vcg which, applied to the gate of each memory cell 1 of the matrix, allows to discriminate the programmed state from the erased state of the memory cell 1 itself.

In particular, the reading reference voltage Vcg generated by the voltage generator is used to read the current flowing in each memory cell 1. In a conventional way as shown in FIG. 3, for each memory cell 1 a high logic state "1" and a low logic state "0" are associated with a predetermined drain current value Id so as to discriminate a programmed state from an erased state of this cell. As it is known, the response curve Id(Vcg) is function of a capacity Cpp which is formed in the memory cell under examination between the second polysilicon layer poly2 and the first polysilicon layer polyfg above it in a direction Z substantially perpendicular to the directions X and Y whose value is given by:

$$Cpp_{std} = \varepsilon_{ox} L_{polyfg} (W_{polyfg} + 2*th_{polyfg})/th_{ONO} \quad (1)$$

$L_{polyfg}$ being the length of the floating gate 5, $W_{polyfg}$ being the length of this floating gate 5 in correspondence with the channel region, in particular between two successive openings 4, $th_{polyfg}$ being the thickness of the first polysilicon layer polyfg and $th_{ONO}$ the thickness of the interpoly layer 6.

Then, with reference to FIG. 1B the value of the capacity Cpp given by the above reported formula (2) comprises a first term which depends on the coupling between the first polysilicon layer polyfg and the second polysilicon layer poly2, and a second term which depends on the coupling between the first polysilicon layer polyfg and the second polysilicon layer poly2, in the direction X where the second polysilicon layer poly2 enters in the openings 4 between two adjacent floating gates.

It is advantageous to realize the reference cells of the reading voltage generator in a similar way to the memory cells 1 for ensuring a same response curve of these reference cells at an equal drain current Id and then, in particular, to have a same progress of reading reference voltage Vcg generated.

In the case in which the reference cell shows a different value of the interpoly capacity with respect to that of the memory cell 1, such as for example that shown in the diagram of FIG. 4, a voltage-current curve V-I is obtained with a different slope with respect to the curves defined by the high "1" and low "0" logic state. In the case indicated in FIG. 4 there is in particular a greater slope for the curve V-I of the reference cell and thus a same reading reference voltage Vcg defines a reduced difference between the current Iref generated by the reference cell and the drain current Id of a memory cell 1 to be read, when this latter is in a low logic state "0". All this generates the possibility of confusion in the definition of the logic states of the memory cell 1 as read through the reference cell. In particular high logic states could be read for current values which instead should define low logic states.

It is thus understood that the reference cells of the reading voltage generator, for discriminating in a correct way the state of the memory cells, must have a capacity Cpp to which a parallel voltage-current curve V-I corresponds substantially contained between the curves defined by the high logic state "1" and by the low logic state "0" of the memory cell 1, as shown in FIG. 3.

In particular, FIG. 3 shows a curve V-I of a reference cell in a virgin or original state, i.e., without any charge in the relative floating gate, suitable for allowing the discrimination between the two memory cell states 1: high and low. It is obvious that in the case of multilevel cells more curves will be necessary for identifying different logic states of the multilevel memory cell.

It is usual, at the end of the manufacturing process, to discharge the reference cells through exposure to ultraviolet rays to bring the cells themselves to the condition of "virgin" cells. This exposure allows to completely discharge the charges possibly present in the floating gates of these reference cells. Naturally, any time it is necessary to recover the "virgin" state of the cells it is necessary to expose the cells themselves to the ultraviolet rays for completely discharging the relative floating gates.

Unfortunately, the extremely reduced sizes nowadays reached by the cells at the end of the manufacturing process make the discharge operation by means of exposure to UV rays exacting and complex. Further, any time the "virgin" state or a desired biasing state of the reference cells of the voltage generator is to be recovered, it is necessary to resort to the exposure to UV rays.

A technical problem is that of devising an architecture of a reference voltage generator for the reading of memory cells able to periodically discharge the floating gates of the reference cells contained therein without the use of UV rays maintaining a structure substantially similar to the current structure and showing a simple architecture as well as reduced realization times, in this way overcoming the limits and drawbacks which still affecting the circuits realized according to the prior art.

BRIEF SUMMARY

One embodiment realizes reference cells having floating gate regions accessible through a contact terminal and discharges them by employing a suitable transistor, periodically activated.

One embodiment is a reading voltage generator comprising at least one array enabled by an access transistor, said array comprising in turn at least one reference cell associated with a relative select transistor, said select and access transistors and said at least one reference cell being realized on a semiconductor substrate and having active regions delimited by suitable field oxide regions and covered by a tunnel oxide layer and comprising at least one floating gate realized by a first polysilicon layer and covered by a dielectric layer and by a second polysilicon layer.

One embodiment is a manufacturing process of a reading voltage generator for a matrix of EEPROM non-volatile memory cells of the type comprising at least one array having a first row with at least one reference cell associated with a second row of respective select transistors and having at least one access transistor for said second row, said at least one reference cell and said select and access transistors being realized on a silicon substrate wherein active regions and suitable field oxide regions are defined, the process carrying out the following steps for realizing said transistors and said reference cells:

growth of a tunnel oxide on said substrate; and
deposition on said tunnel oxide of a first polysilicon layer and relative doping.

The characteristics and the advantages of the present invention will be apparent from the following description of an embodiment thereof given by way of indicative and non-limiting example with reference to the annexed drawings.

BRIEF DESCRIPTION OF THE SEVERAL VIEWS OF THE DRAWINGS

In these drawings:

FIGS. 3 and 4 show the progress of signals relative to a reference cell of the known type;

FIG. 6 schematically shows a section view of a reference cell of the generator of FIG. 5;

FIGS. 7-11 schematically show section views of portions of the voltage generator of FIG. 5;

DETAILED DESCRIPTION

With reference to these figure, 100 schematically indicates a reading voltage generator according to one embodiment, suitable for generating a reading reference voltage for a matrix of non-volatile memory cells of a semiconductor memory device, in particular of the EEPROM type, not shown in the figures since conventional.

Figure 5:
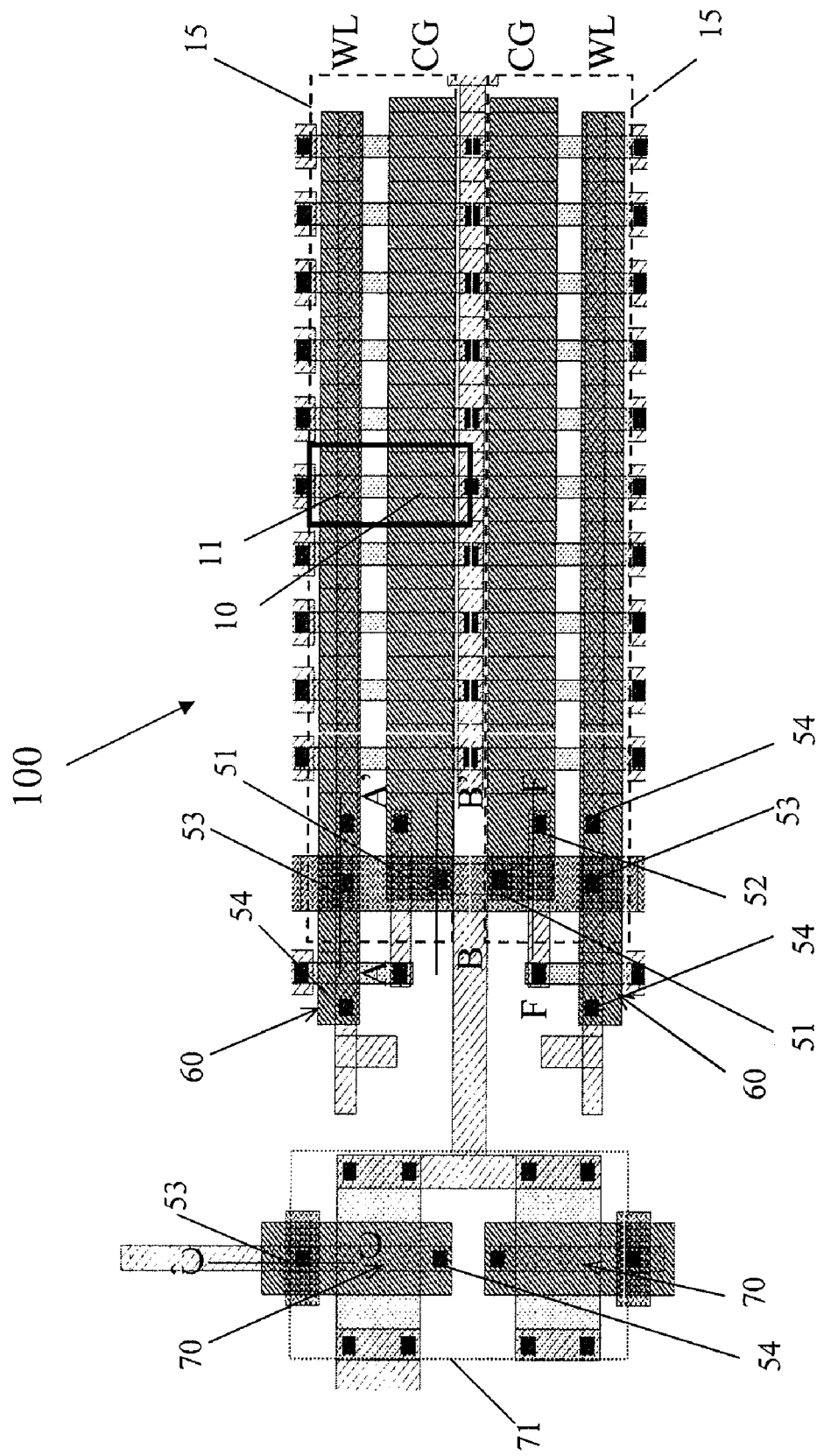
FIG. 5 schematically and partially shows a voltage generator realized according to one embodiment of the present invention.

More specifically, in FIG. 5 100 indicates only a portion of the reading voltage generator and, in particular, it does not show the circuitry suitable for generating a reading voltage, which remains realized according to the prior art.

The voltage generator 100 comprises at least one array 15 having at least one reference cell 10 suitable for generating a requested reference voltage and at least one access transistor 60 suitable for enabling said array 15. The architecture of the voltage generator 100 in the embodiment indicated shows the array 15 with a plurality of reference cells 10 arranged in parallel to each other and realized on respective first rows CG. Each reference cell 10 is associated with a respective select transistor 11 realized on a second row WL adjacent to the first row CG. In this way, the architecture of the voltage generator 100 comprises a pair of first rows CG of cells 10 facing each other and a pair of second rows WL of select transistors 11 external with respect to the first rows CG.

The array 15 of the reading voltage generator 100 comprises a number of reference cells 10 corresponding to the design needs of the semiconductor memory device associated therewith.

Advantageously, the architecture of the voltage generator 100 comprises access transistors 60, one for each first row CG of the array 15, and suitable discharge transistors 70, these latter preferably realized in an area 71 arranged for the aim in front of the access transistors 60 with respect to a direction defined by these first and second rows, CG and WL.

According to a first embodiment of the present invention, as shown in FIG. 6, a reference cell 10 comprises a polysilicon substrate 20, where an active region 85 and respective first 80 and second 81 field oxide regions are realized. The reference cell 10 also comprises a gate oxide layer 23 overlapped onto this silicon substrate 20 and onto this active region 85 and onto these field oxide regions 80 and 81, covered in turn by a first polysilicon layer 25, also called polyfg, by a dielectric layer 26, called interpoly, and by a second polysilicon layer 27, also called poly2.

The first polysilicon layer 25 polyfg thus forms a floating gate insulated from the dielectric layer 26 and the second polysilicon layer 27 poly2 forms a control gate of the reference cell 10.

Advantageously, the floating gate 25 of the reference cells 10 of a same first row CG is realized by a first continuous polysilicon stripe 30, as shown in FIG. 9.

Then, the first polysilicon stripe 30 is uninterrupted along the corresponding first row CG.

Suitably, moreover, the first continuous polysilicon stripe 30 and the second polysilicon layer 27 poly2 are self-aligned both in the direction of the rows and in the perpendicular direction of the columns of the array 15.

In particular then, differently from the reference cells realized according to the prior art, the floating gate 25 of each reference cell 10 of a same array 15 is not insulated from the floating gate 25 of the adjacent cells realized in a same first row CG. Suitably, in fact, the first continuous polysilicon stripe 30 is unique for all the reference cells 10 composing the array 15 which belong to the same first row CG.

In this way, the value of the capacity Cpp between the first polysilicon layer polyfg and the second polysilicon layer poly2 of the reference cells 10 present in the reading voltage generator is given by the formula:

$$Cpp = \epsilon_{ox} L_{polyfg}(W_{polyfg} + \text{hole}_{polyfg})/th_{ONO} \quad (2)$$

where: $L_{polyfg}$ is the length of the floating gate 25 polyfg, $W_{polyfg}$ and $\text{hole}_{polyfg}$ is the width of the floating gate 25 of a single reference cell 10, indicated also with X-pitch in FIG. 6, and $th_{ONO}$ is the thickness of the interpoly dielectric layer 26.

Figure 1A:
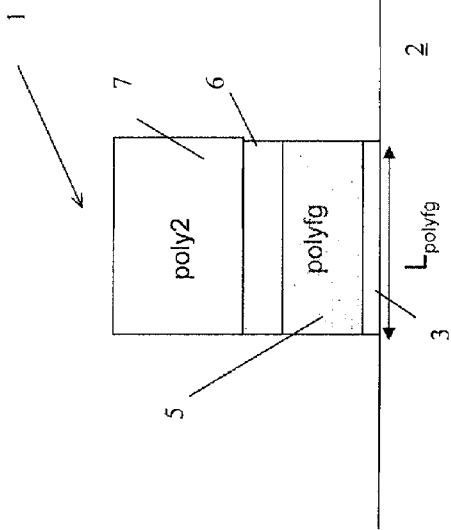
FIGS. 1A and 1B schematically show sections of a reference cell of the known type, realized along two perpendicular directions X and Y.
Figure 1B:
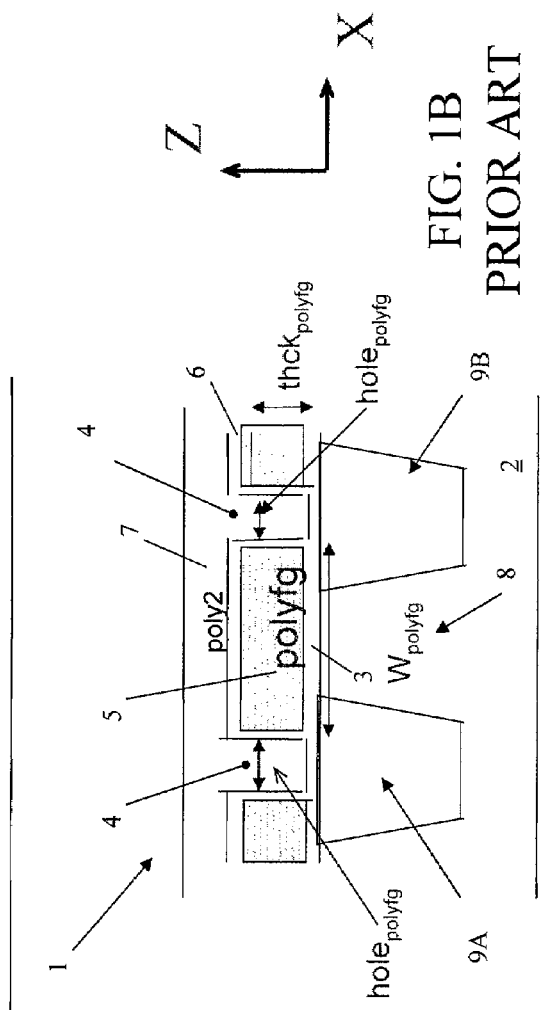
Figure 2:
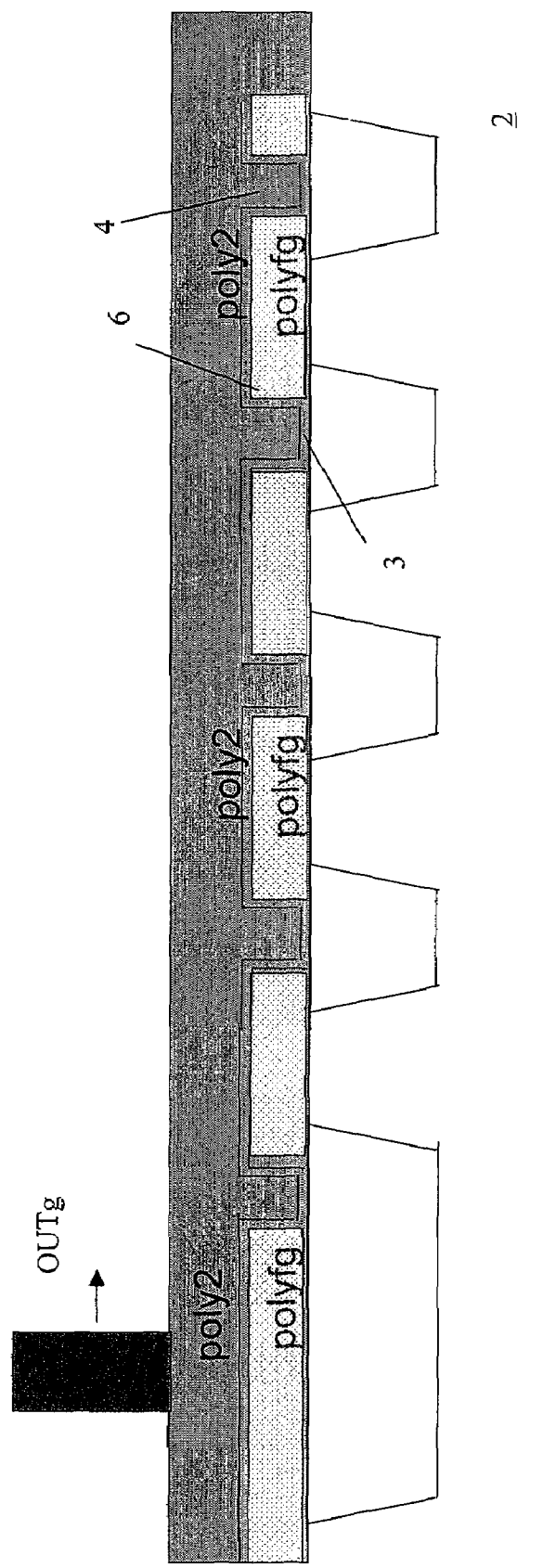
FIG. 2 shows a portion of a voltage generator of the known type.

It can be observed that, in the case in which the memory cells of the matrix of the device are realized according to what has been previously indicated in the prior art and shown in FIGS. 1A and 1B, they show a capacitance $CPP_{std}$ whose value is given by the formula (1), i.e., $$Cpp_{std} = \epsilon_{ox} L_{polyfg}(W_{polyfg} + 2 \cdot th_{polyfg})/th_{ONO} \quad (1)$$

Where $L_{polyfg}$ is the length of the floating gate polyfg of a single cell, $W_{polyfg}$ is the width of this floating gate between two successive openings, $th_{polyfg}$ is the thickness of the layer polyfg and $th_{ONO}$ is the thickness of the interpoly layer.

It can be observed how the values Cpp and $CPP_{std}$ are equal in the case in which:

$$2 \cdot th_{polyfg} = \text{hole}_{polyfg}. \quad (3)$$

In the case in which the previous condition (3) is very far from occurring, a correction can be applied to the reading reference voltage Vcg generated by the reading voltage taking into account the difference of the interpoly capacitances Cpp and $Cpp_{std}$, even if the latter process generations show such characteristics as to meet the indicated equivalency.

Advantageously, as shown in FIGS. 5 and 9, the architecture of the voltage generator 100 comprises suitable first contact terminals 51 which allow to connect the first continuous polysilicon stripe 30 of each first row CG with at least one drain terminal of the discharge transistors 70.

Suitably, each first row CG, as shown in FIG. 8A, also has, in correspondence with a same end, a first opening 55 suitable for allowing each first contact terminal 51 to reach the respective first continuous polysilicon stripe 30.

The first opening 55 is realized by means of a mask, by respectively etching the second polysilicon layer 27 poly2 and the interpoly dielectric layer 26, thus allowing to reach the underlying first continuous polysilicon stripe 30.

Advantageously the discharge transistor 70 is activated in a timed way and allows to discharge the first continuous polysilicon stripe 30 and in particular to discharge the floating gate of all the reference cells 10 of each first row CG of the array 15, in a simultaneous way and with a single terminal.

The select transistors 11, realized in a similar way to the reference cells 10, also show a double polysilicon layer structure, a first layer 25 polyfg and a second layer 27 poly2, with interposition of an interpoly dielectric layer 26.

Advantageously, the first polysilicon layer 25 polyfg of these select transistors 11 is continuous on each second row WL, and is realized as a single second continuous polysilicon stripe 31.

Thus, the second polysilicon stripe 31 is uninterrupted along the corresponding second row WL.

Suitably, as highlighted in the section of FIG. 7, each second row WL shows a second opening 56 realized in correspondence with the first opening 55.

The second opening 56 is obtained by means of a suitable mask, by respectively etching the second polysilicon layer 27 poly2 and the interpoly dielectric layer 26, thus allowing to reach the first polysilicon layer 25, i.e., the second continuous polysilicon stripe 31.

In particular, the first 55 and the second opening 56 are realized by means of a single mask.

Suitably, moreover, each access transistor 60 is realized in a similar way to the select transistors 11. Further and advantageously, as highlighted in FIGS. 5 and 9, the architecture of the voltage generator 100 comprises second contact terminals 52 which connect the second polysilicon layer 27 or control gate of each first row CG of the array 15 to a source terminal of the access transistors 60.

Suitably, each discharge transistor 70, realized in a similar way to the reference cells 10 and shown in FIG. 8B, shows a double polysilicon layer structure, a first 25 and a second 27 polysilicon layer, with the interposition of a dielectric layer 26.

Each discharge transistor 70 shows a third opening 57 obtained by means of suitable mask, by respectively etching the second upper polysilicon layer 27 and the dielectric layer 26 thus allowing to reach the first polysilicon layer 25.

Figure 10:
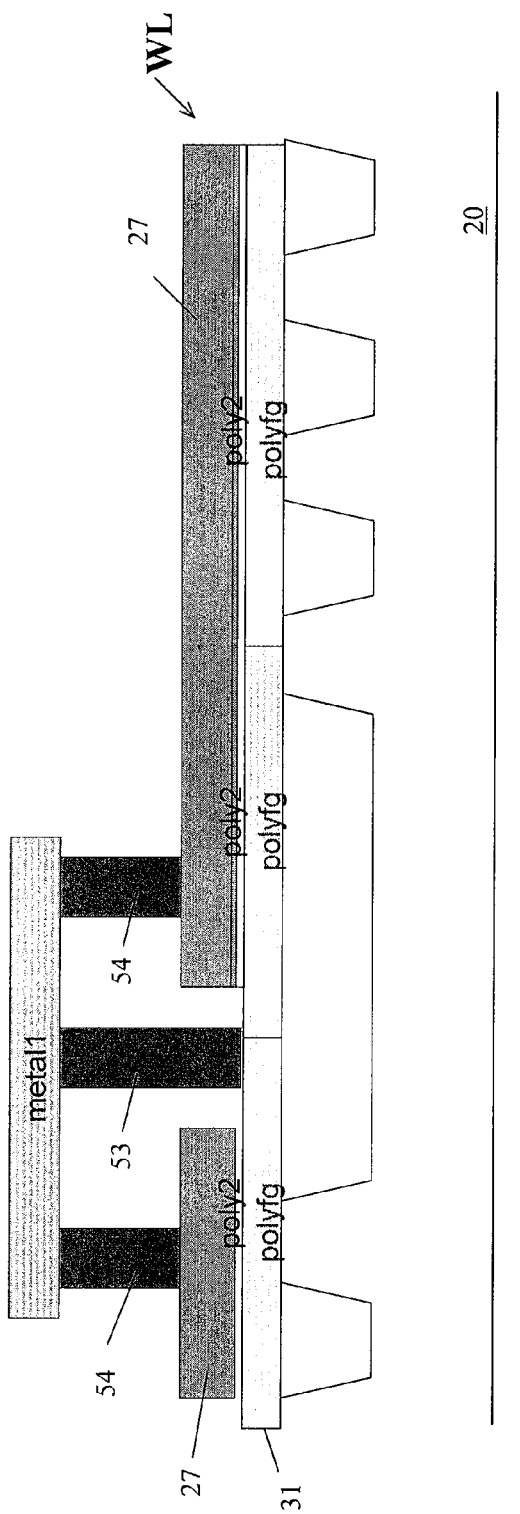

The architecture of the voltage generator 100, as schematically indicated in FIG. 5 and in FIG. 10, further comprises third contact terminals 53 and fourth contact terminals 54 which allow to connect to each other, by short-circuiting them, the first polysilicon layer 25 and the second polysilicon layer 27 of each discharge 70, access 60 and select 11 transistor. This, suitably, allows to avoid that in each discharge 70, access 60 and select 11 transistor the control gate 27 remains floating.

As regards the operation of the voltage generator 100, when a reading reference voltage Vcg must be generated, the discharge transistors 70 are previously turned on allowing the simultaneous discharge of all the charges present in the floating gates of each row CG of the array 15 of the reading voltage generator 100 making it possible the discharge of the first continuous polysilicon stripe 30 and then of the floating gates of all the reference cells 10.

One embodiment is a process for manufacturing a reading voltage generator for a matrix of memory cells, of the EEPROM type, as previously described for which details and cooperating parts having the same structure and function will be indicated with the same numbers and reference acronyms.

The process steps and the structures hereafter described do not form a complete process flow for the manufacturing of the reading voltage generator. The present invention can be put into practice together with the manufacturing techniques of the integrated circuits currently used in the field, hereafter only those process steps that are necessary for the comprehension of the present invention are included.

Figure 12A:
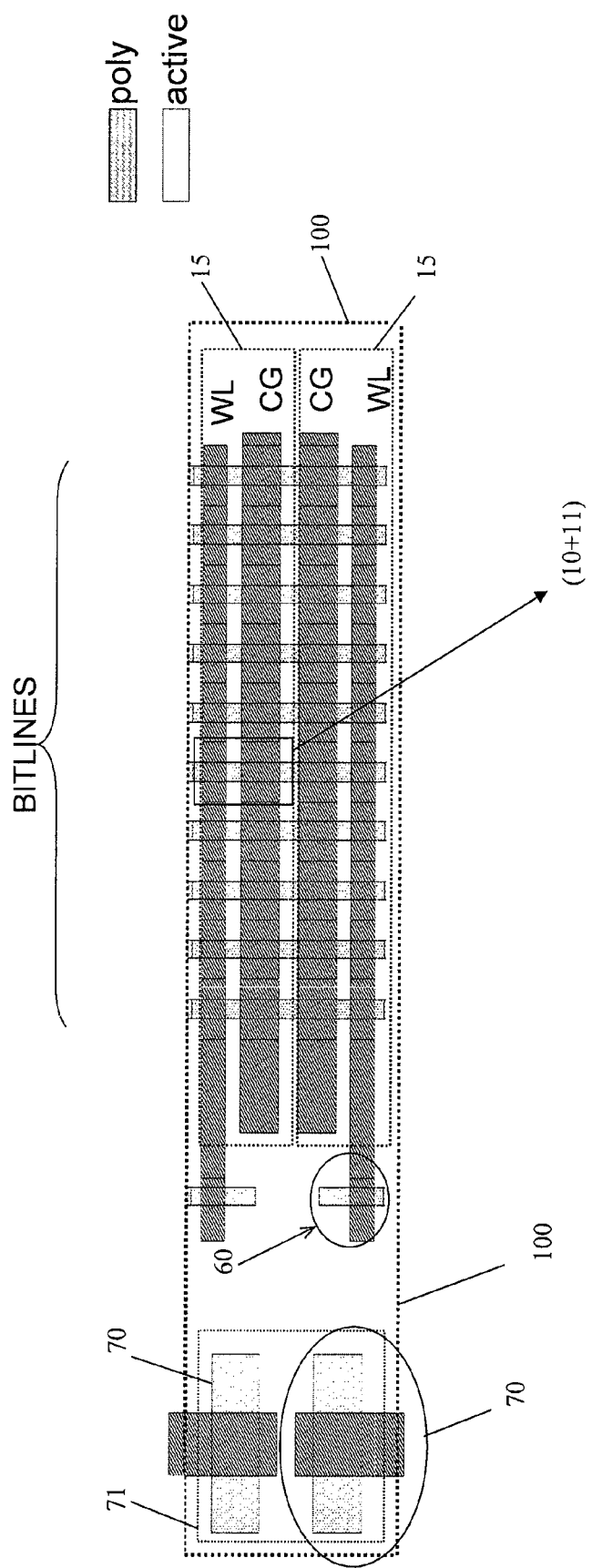
FIGS. 12A-12C schematically show a plan view of an array of reference cells and the respective charge transistors being part of the voltage generator realized according to the present invention in different steps of the realization process.
Figure 12B:
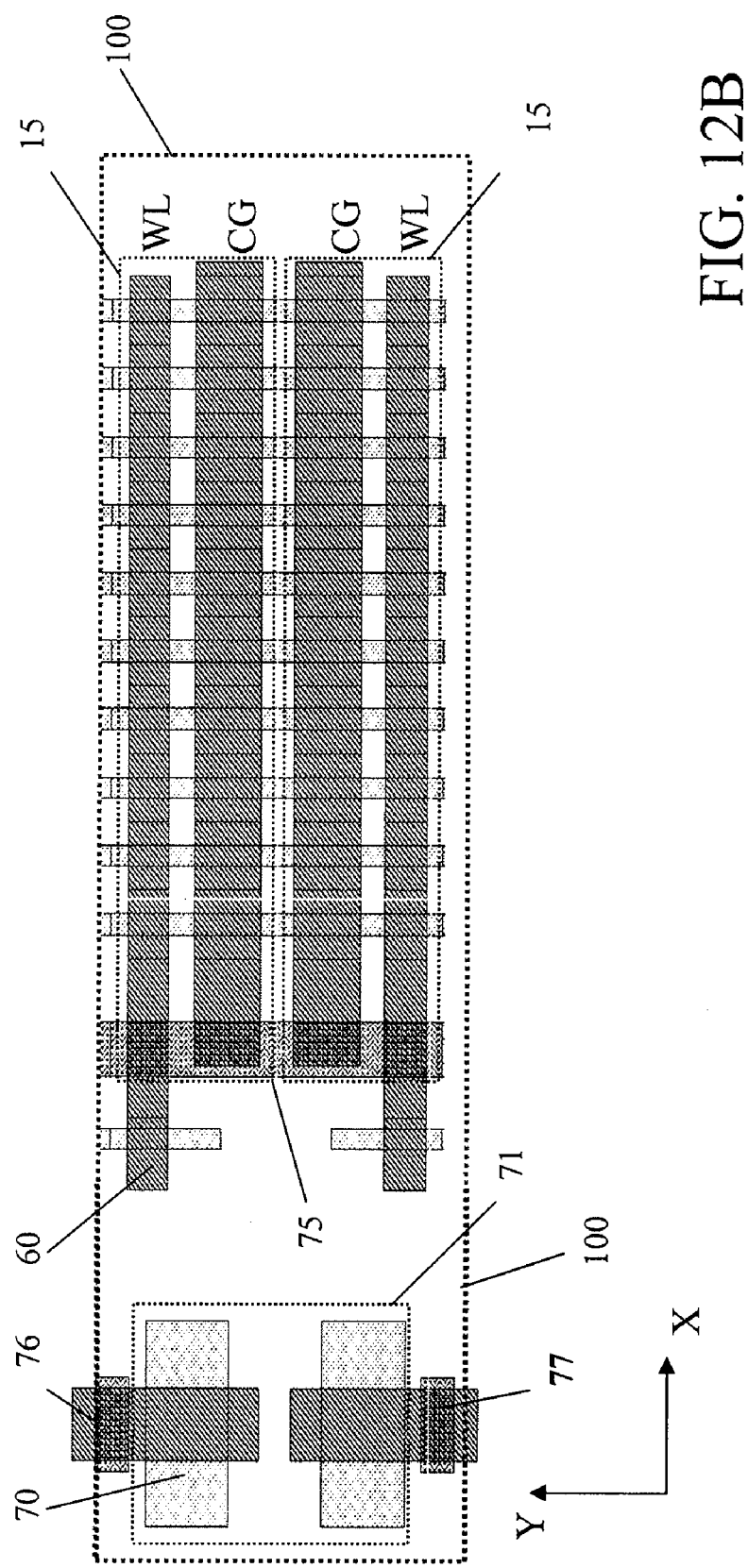
Figure 12C:
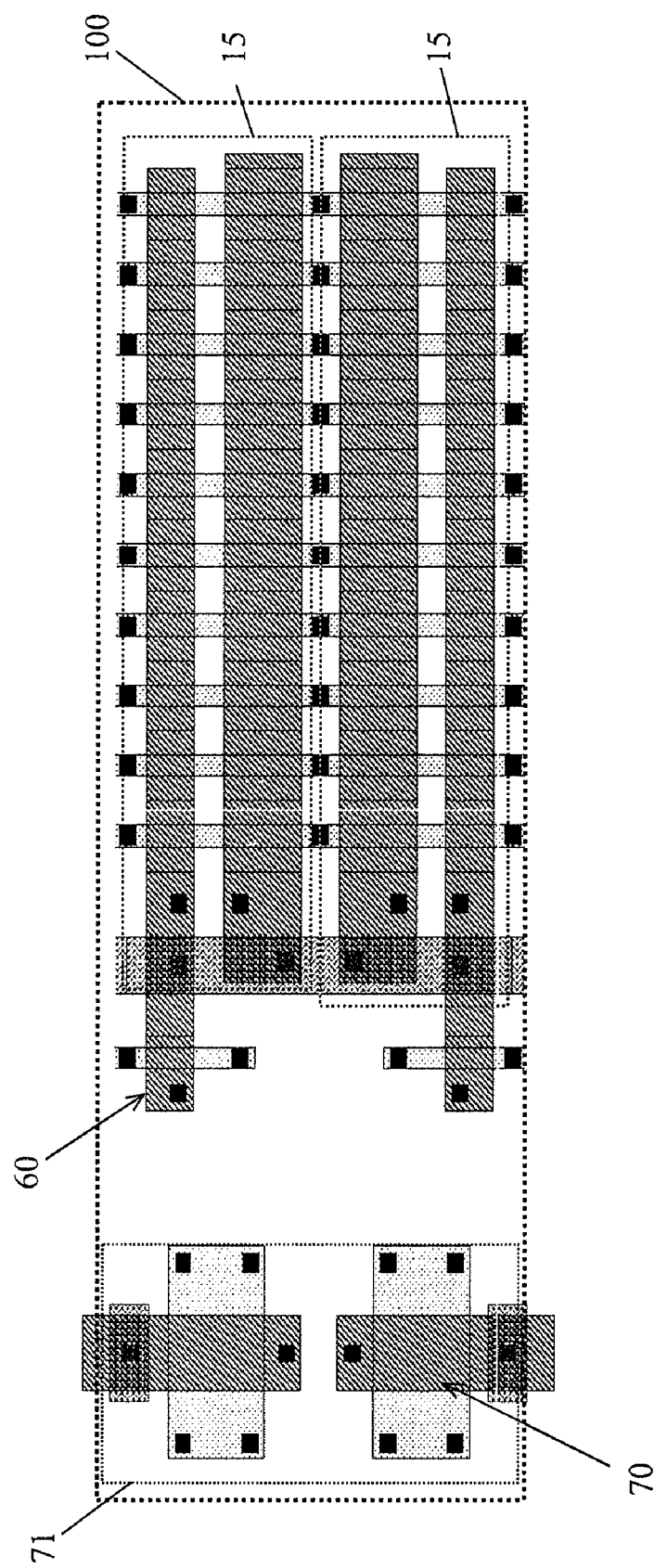

With reference to the annexed figures and in particular to FIGS. 12A-12C hereafter the process steps according to the invention will be analyzed which lead to the realization of the reading voltage generator 100 for a matrix of memory cells of a semiconductor memory device.

By following a standard process and according to the design needs, a plurality of arrays 15 are formed, each comprising a first row CG with at least one reference cell 10 associated with a second row WL of respective select transistors 11. Each reference cell 10 in the first row CG is suitably associated with a select transistor 11 realized in the second row WL.

The voltage generator 100 shown in the figures, provides, in particular, two first rows CG alternated by two second rows WL as well as suitable access transistors 60, one for each first row CG, realized at one end of the second rows WL.

Advantageously, according to the present embodiment, the generator 100 provides suitable discharge transistors 70 preferably realized in front of the access transistors 60, in an area 71 arranged for this aim.

As highlighted in particular in the section of FIG. 6, starting from a silicon substrate 20, wherein active areas 85 and suitable field oxide regions 80, 81 are defined, the following steps are carried out to realize the cells composing the reference voltage generator:

growth of a tunnel oxide 23 on the silicon substrate 20;

deposition on the tunnel oxide 23 of a first polysilicon layer 25 polyfg and relative doping;

formation of an interpoly dielectric layer 26 above the silicon substrate 20, which can be either deposited or grown;

deposition of a second polysilicon layer 27 poly2, with relative doping;

first masking of the second polysilicon layer 27 poly2, to form the control gates for the select transistors 11, for the reference cells 10, for the access transistors 60 and for each discharge transistor 70, as well as the floating gates for the reference cells 10 in the first rows CG and for the select transistors 11 in the second rows WL of the array 15;

first simultaneous etching of the second polysilicon layer 27 poly2, of the dielectric layer 26 and of the first polysilicon layer 25 polyfg for the definition of the control gates as well as of a first continuous stripe 30 and of a second continuous stripe 31 of the first polysilicon layer 25 respectively in correspondence with each first row CG and with each second row WL of the array 15.

Advantageously, the first masking for the realization of the control gates allows a self-aligned and simultaneous etching of the second polysilicon layer 27, of the dielectric layer 26 and of the first polysilicon layer 25 polyfg in both the directions X and Y perpendicular to each other of the plane of the architecture, indicated in FIG. 12B.

Suitably, the manufacturing process provides the step of second masking, by means of a second mask, of the second polysilicon layer 27, as shown in FIG. 12B, this second mask comprising a first slot 75 realized in the direction Y, arranged next to an end of the first rows CG, extending to cover the second rows WL external to the first rows CG, as well as a second 76 and a third slot 77, realized in the direction X, in parallel to each other and on the opposite side with respect to the area 71 arranged to contain the discharge transistors 70;

second etching of the second polysilicon layer 27 and of the dielectric layer 26 to define, as shown in FIGS. 7, 8A, 8B and 9, first openings 55, next to the ends of the first rows CG, second openings 56 next to the ends of the second rows WL, as well as to defined third openings 57 in correspondence with the discharge transistors 70. These first openings 55, second openings 56 and third openings 57 allow to reach respectively the first polysilicon layer 25, i.e., the first continuous polysilicon stripe 30 of the reference cells 10, the second continuous polysilicon stripe 31 of the select transistors 11 and singularly the floating gate of each of the discharge transistors 70.

Then, the first 30 and the second 31 polysilicon stripes are, advantageously, uninterrupted along the corresponding first rows CG and second rows WL.

The process then goes on with a flow of steps which provide:

formation of a salicide layer in correspondence with the first openings 55, of the second openings 56 and of the third openings 57 as well as of the second polysilicon layer poly2;

formation of premetal contacts, as shown in particular in FIG. 12C on said first row CG and second row WL of each array 15, on said access 60 and discharge 70 transistors.

Figure 11:
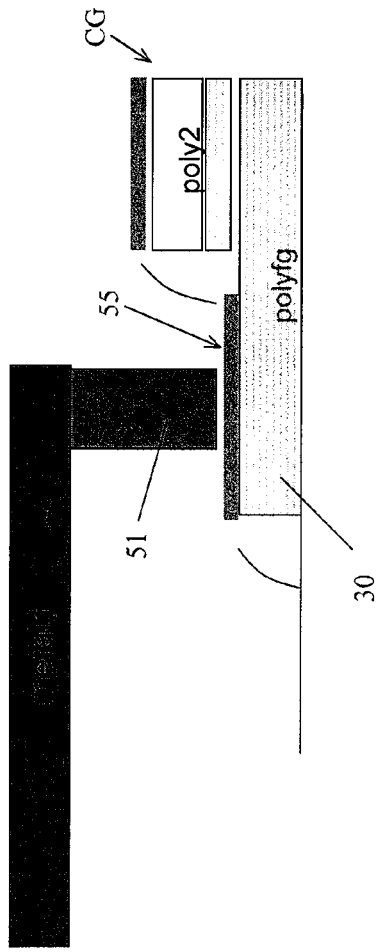

The process then provides, as shown in particular in FIGS. 9, 10 and 11, the definition of first contact terminals 51 which allow to connect, by means of suitable metallization lines, the first continuous polysilicon stripe 30 of each first row CG with a drain terminal of the discharge transistors 70. Moreover, the process provides the definition of second contact terminals 52 which allow to connect the second polysilicon layer 27 poly2 or control gate of each first row CG to a source terminal of the access transistors 60, as well as third contact terminals 53 and fourth contact terminals 54 which allow to connect to each other, by short-circuiting them, the first polysilicon layer 25 polyfg and the second polysilicon layer 27 poly2 of each discharge transistor 70, of each access transistors 60 and of the select transistors 11 to avoid that in each of them the control gate 27 remains floating.

The voltage generator 100 finds valid application in an embodiment described hereafter for which details and cooperating parts having the same structure and function will be indicated with the same numbers and reference acronyms as previously used and described.

Figure 13:
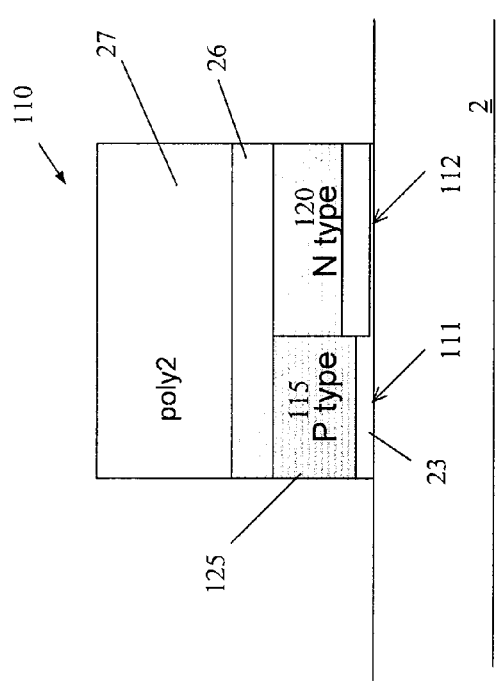
FIG. 13 shows a particular EEPROM cell to be used with the voltage generator according to one embodiment of the invention.
Figure 14:
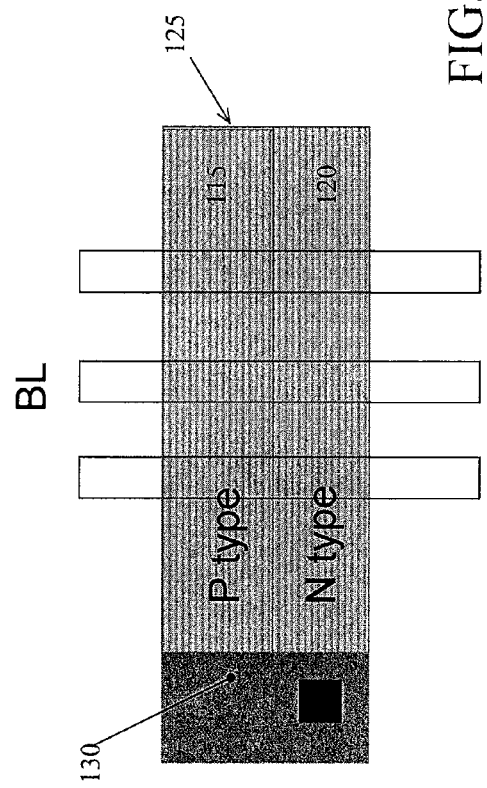
FIG. 14 shows a further embodiment of a voltage generator according to the present invention to be used with reference cells of the type of FIG. 13.

FIG. 13 shows a section of a double polysilicon layer EEPROM cell 110.

The cell 110 is formed above a polysilicon layer 2 with an overlapped gate oxide layer 23 and comprises a first polysilicon layer 125, which defines the floating gate of the cell 110, which has double doping, i.e., it shows a first portion 115 flanked to a second portion 120.

In particular, the first portion 115 is realized with a first type of dopant, for example of the P type, while the second portion 120 is realized with a second dopant, of the N type.

Moreover, suitably, the first portion 115 is realized on a tunnel region 111, while the second portion 120 is realized on a channel region 112 of the polysilicon layer 2.

Advantageously, the process in the case of the present cell 110, allows, with the definition of the first openings 55 next to the ends of the first rows CG of the array of the reading voltage generator, to uncover a whole polysilicon stripe 125 thus allowing the formation of a salicide layer 130 on both portions, the first portion 115 and the second portion 120.

Thanks to the presence of the salicide layer 130, the formation is avoided of a diode junction P-N between the first 115 and the second portion 120 thus allowing the discharge of the polysilicon layer 125 or floating gate by discharge transistors, such as the discharge transistor 70.

An advantage is that of making it externally accessible by means of a contact terminal the floating gate 25, 125 of the reference cells, allowing its discharge through one or more discharge transistors 70.

A further advantage is due to the fact that making the floating gates of the single reference cells a continuous polysilicon stripe 30, for each first row CG of the array, it is possible to contact by means of a single contact terminal 51 the floating gate of all the reference cells 10 belonging to this first row CG making it thus easy and simple the complete discharge of the floating gates.

A further advantage is the possibility to realize reference cells with capacitances Cpp substantially corresponding to the capacitances $Cpp_{std}$ of the matrix memory cells, maintaining the curve V-I almost unvaried. With the latter generations of devices realized the above indicated condition almost always occurs, and, in this case, corrections to the generated reading reference voltage Vcg are no more necessary since it corresponds to the voltage requested by the cells of the matrix. In fact, from tests carried out by the Applicant, it has been verified that the coupling contribution between the first polysilicon layer polyfg and the second polysilicon layer poly2 in the direction X of the standard cells which can be seen in FIG. 1B and which is not present in the reference cell 100, is compensated by an increase of the coupling contribution in the direction Z due to a greater width in this direction of the floating gate.

A further advantage is given by the simplicity of realization of the process, which allows to reduce the standard process steps, by simultaneously etching with a single mask and in a self-aligned way the second polysilicon layer 27 poly2, the dielectric layer 26 and the first polysilicon layer 25 polyfg. The continuous polysilicon stripe 30, the discharge transistors 70, the openings 55, 57 and the contact terminals 51, 53 are all realized through the same masks of the traditional process.

An advantage is that reference cells can be employed with a floating gate with double doping.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A reading voltage generator, comprising:
an array that includes a reference cell, a select transistor associated with the reference cell, an access transistor coupled to the select transistor, and a first contact terminal, said select and access transistors and said reference cell realized on a semiconductor substrate and having active regions delimited by suitable field dielectric regions covered by a tunnel dielectric layer, the reference cell comprising a floating gate realized by a first conductive layer in contact with the first contact terminal, the floating gate covered by the tunnel dielectric layer and by a second conductive layer; and
a discharge transistor electrically coupled to the first contact terminal.

2. A reading voltage generator according to claim 1, wherein said array comprises a first row with a plurality of reference cells each including a floating gate and a second row with a plurality of select transistors, wherein said floating gates of said reference cells are respective portions of a first continuous conductive stripe realized on said first row and contacted by said first contact terminal.

3. A reading voltage generator according to claim 2, wherein said first row has at one end a first opening which allows said first contact terminal to reach said first continuous conductive stripe.

4. A reading voltage generator according to claim 3, wherein said first conductive layer includes a second continuous conductive stripe realized on said second row.

5. A reading voltage generator according to claim 4, wherein said second row has next to one end thereof a second opening that reaches said second continuous conductive stripe.

6. A reading voltage generator according to claim 5, wherein said access transistor is realized on said second row of said array.

7. A reading voltage generator according to claim 6, comprising a second contact terminal which connects said second conductive layer of said first row of said array to a source terminal of said access transistor.

8. A reading voltage generator according to claim 7, wherein said discharge transistor has a third opening which allows to reach the first conductive layer, the reading voltage generator further comprising a third contact terminal and a fourth contact terminal connecting said first conductive layer with said second conductive layer.

9. A reading voltage generator according to claim 1 wherein the first and second conductive layers are polysilicon layers and the tunnel dielectric layer is a tunnel oxide layer.

10. A process for manufacturing a reading voltage generator, comprising:
forming an array that includes a first reference cell, a first select transistor associated with the first reference cell, a first access transistor, and a first contact terminal, said select and access transistors and said reference cell being realized on a semiconductor substrate and having active regions delimited by suitable field dielectric regions covered by a tunnel dielectric layer, the reference cell including a floating gate realized by a first conductive layer in contact with the first contact terminal, the floating gate being covered by the tunnel dielectric layer and by a second conductive layer; and
forming a discharge transistor electrically coupled to the first contact terminal.

11. A process according to claim 10 wherein forming the array comprises:
forming a tunnel dielectric on a substrate;
forming on said tunnel dielectric a first conductive layer;
forming an interlevel dielectric layer above said substrate;
forming a second conductive layer above said interlevel dielectric layer;
masking said second conductive layer using a first mask;
forming first and second continuous stripes from the first conductive layer by self-aligned etching, using the first mask, said second conductive layer, said interlevel dielectric layer and said first conductive layer, the first continuous stripe having respective portions for serving as respective floating gates of a first row of reference cells including the first reference cell, the second continuous stripe having respective portions for serving as respective floating gates of a second row of select transistors including the first select transistor, the self-aligned etching forming control gates of the reference cells of the first row, the select transistors of the second row, the access transistor, and a discharge transistor.

12. A process according to claim 11, further comprising:
masking said second conductive layer using a second mask including a first slot arranged next to an end of said first row and extending to cover said second row, a second slot and a third slot realized in parallel to each other on opposite sides with respect to said discharge transistor;
etching said second conductive layer and said interlevel dielectric layer to define a first opening next to an end of said first row, a second opening next to an end of said second row, and a third opening in correspondence with said discharge transistor, said first opening, said second opening, and said third opening allowing to reach said first continuous stripe, said second continuous stripe and the floating gate of said discharge transistor, respectively.

13. A process according to claim 12, further comprising:
forming premetal contacts on said first row and second row of said array, on said first access transistor, and on said discharge transistor;
defining said first contact terminal which couples said first continuous stripe to a drain terminal of said discharge transistor;
defining a second contact terminal which couples said second conductive layer of said first row to a source terminal of said access transistor;
defining third contact terminals in contact with the second continuous stripe and the floating gate of the discharge transistor, respectively; and
defining fourth contact terminals in contact with the control gates of the discharge transistor, first access transistor, and the first select transistor, respectively, the fourth contact terminals being coupled to the third contact terminals to couple the control gates of the discharge transistor, first access transistor, and the first select transistor to the second continuous stripe and the floating gate of the discharge transistor.

14. A process according to claim 12, further comprising:
depositing a salicide layer in correspondence with said first opening, above said first conductive layer prior to realizing said first contact terminal.

15. A device, comprising:
an array that includes an access transistor and a first contact terminal, said access transistor realized on a semiconductor substrate and having an active region covered by a tunnel dielectric layer, the access transistor comprising a floating gate realized by a first conductive layer in contact with the first contact terminal, the floating gate covered by a dielectric layer and by a second conductive layer, said array comprising a first row with a plurality of reference cells, each cell including a floating gate and a second row with a plurality of select transistors, wherein said floating gates of said reference cells are respective portions of a first continuous conductive stripe realized on said first row and contacted by said first contact terminal; and
a discharge transistor electrically coupled to the first contact terminal.

16. The device of claim 15, wherein said first row has at one end a first opening which allows said first contact terminal to reach said first continuous conductive stripe.

17. The device of claim 16, wherein said first conductive layer includes a second continuous conductive stripe realized on said second row.

18. The device of claim 17, wherein said second row has next to one end, a second opening which allows to reach said second continuous conductive stripe.

19. The device of claim 18, wherein said access transistor is realized on said second row of said array.

20. The device of claim 17, comprising a second contact terminal which couples said second continuous conductive stripe to a source terminal of said access transistor.

21. A device, comprising:
an array that includes an access transistor and a first contact terminal, said access transistor realized on a semiconductor substrate and having an active region covered by a tunnel dielectric layer, the access transistor comprising a floating gate realized by a first conductive layer in contact with the first contact terminal, the floating gate covered by a dielectric layer and by a second conductive layer, and a discharge transistor electrically coupled to the first contact terminal, wherein said discharge transistor has a third opening that allows to reach the first conductive layer, the reading voltage generator further comprising a third contact terminal and a fourth contact terminal connecting said first conductive layer with said second conductive layer.

22. The device of claim 21 wherein the first and second conductive layers are polysilicon layers and the tunnel dielectric layer is a tunnel oxide layer.

* * * * *